(12) United States Patent
Sanchez Gonzalez et al.

(10) Patent No.: US 11,209,492 B2
(45) Date of Patent: Dec. 28, 2021

(54) METHOD AND SYSTEM FOR DETERMINING BATTERY STATE OF HEALTH

(71) Applicant: Continental Automotive Systems, Inc., Auburn Hills, MI (US)

(72) Inventors: Emmanuel Izcoatl Sanchez Gonzalez, Tlaquepaque (MX); Enrique Samuel Carbajal Abud, Zapopan (MX); Edwin Mera Avila, Tlajomulco de Zuniga (MX)

(73) Assignee: Continental Automotive Systems, Inc., Auburn Hills, MI (US)

( * ) Notice: Subject to any disclaimer, the term of this patent is extended or adjusted under 35 U.S.C. 154(b) by 49 days.

(21) Appl. No.: 16/591,255

(22) Filed: Oct. 2, 2019

(65) Prior Publication Data

US 2021/0103003 A1 Apr. 8, 2021

(51) Int. Cl.
*G01R 31/392* (2019.01)
*H02J 7/00* (2006.01)
*G01R 31/3835* (2019.01)

(52) U.S. Cl.
CPC ....... *G01R 31/392* (2019.01); *G01R 31/3835* (2019.01); *H02J 7/0029* (2013.01); *H02J 7/0047* (2013.01); *H02J 7/0063* (2013.01); *H02J 2007/0067* (2013.01)

(58) Field of Classification Search
CPC . G01R 31/392; G01R 31/3835; H02J 7/0047; H02J 7/0063; H02J 7/0029; H02J 2007/0067
See application file for complete search history.

(56) References Cited

U.S. PATENT DOCUMENTS

| | | | |
|---|---|---|---|
| 7,676,334 B2 | 3/2010 | Matsuura et al. | |
| 8,111,037 B2 | 2/2012 | Zhang et al. | |
| 10,144,306 B2 | 12/2018 | Dudar | |
| 2004/0124990 A1* | 7/2004 | Zur | G01R 31/3644 340/636.1 |
| 2009/0146664 A1* | 6/2009 | Zhang | G01R 31/3648 324/433 |
| 2014/0115858 A1 | 5/2014 | Pisu et al. | |
| 2020/0220369 A1* | 7/2020 | Kemmerer | F02N 11/0848 |
| 2021/0111446 A1* | 4/2021 | Stewart | H02J 7/0021 |
| 2021/0111448 A1* | 4/2021 | Koberstein | H01M 10/635 |

FOREIGN PATENT DOCUMENTS

| | | | | |
|---|---|---|---|---|
| WO | WO-2009158224 A2 * | 12/2009 | | H01M 10/48 |
| WO | WO-2020003070 A1 * | 1/2020 | | G01R 31/3835 |

* cited by examiner

*Primary Examiner* — Stacy Whitmore

(57) ABSTRACT

A battery fault detection system includes a battery providing a battery voltage signal, and a detection circuit. The detection circuit includes a steep drop detector circuit constructed and arranged to detect a first occurrence of a steep voltage drop of the battery voltage signal and establish a time window, with the steep voltage drop detection defining a first condition; a slope measurer circuit constructed and arranged to measure positive slope values of the battery voltage signal; and a slope comparator circuit constructed and arranged to compare a measured positive slope value with a reference voltage and if the measured positive slope value is greater than the reference voltage, a second condition is defined. The detection circuit is constructed and arranged to indicate a properly working battery only upon the occurrence of both the first and second conditions.

12 Claims, 5 Drawing Sheets

METHOD AND SYSTEM FOR DETERMINING BATTERY STATE OF HEALTH

FIELD

This invention relates to a vehicle's battery state of health and, more particularly, to a method and system for determining a battery state of heath without constantly monitoring the battery.

BACKGROUND

Conventional systems that determine a vehicle's battery state of heath typically measure the battery voltage and/or temperature constantly. This results in significant computational effort that makes the system less efficient since an additional load is connected to the vehicle battery for an extended period of time.

Thus, there is a need to provide a method and system for determining a battery state of heath without constantly monitoring the battery voltage and/or temperature.

SUMMARY

An objective of the invention is to fulfill the need referred to above. In accordance with the principles of an embodiment, this objective is achieved by a battery fault detection system having a battery providing a battery voltage signal; and a detection circuit. The detection circuit includes a steep drop detector circuit constructed and arranged to detect a first occurrence of a steep voltage drop of the battery voltage signal and establish a time window, detection of the steep voltage drop defining a first condition. A slope measurer circuit is constructed and arranged to measure positive slope values of the battery voltage signal. A slope comparator circuit is constructed and arranged to compare a measured positive slope value from the slope measurer circuit with a reference voltage and if the measured positive slope value is greater than the reference voltage, the comparison results in a logical high, defining a second condition, and if the measured positive slope value is less than the reference voltage the comparison results in a logical low. The detection circuit is constructed and arranged to set its output to logical high only upon the occurrence of both the first condition: the sudden drop in battery voltage and the second condition: the slope output value being greater than the reference voltage during the time window, which indicates a properly working battery, and if both the first and second conditions do not occur, the detection circuit is constructed and arranged provide a logical low output, which indicates a faulty battery.

In accordance with another aspect of an embodiment, a method detects a state of health of a battery. The method detects, in a first circuit, a first occurrence of a steep voltage drop of a battery voltage signal and establishes a time window. Detection of the steep voltage drop defines a first condition. Positive slope values of the battery voltage signal are measured in a second circuit. A measured positive slope value is compared in a third circuit with a reference voltage and defines a second condition if the measured positive slope value is greater than the reference voltage. A healthy battery state is established only upon the occurrence of both the first condition: the sudden drop in battery voltage and the second condition: the slope output value being greater than the reference voltage during the time window. A faulty battery state is established if both the first and second conditions do not occur.

Other objectives, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF EXEMPLARY EMBODIMENTS

Figure 1:
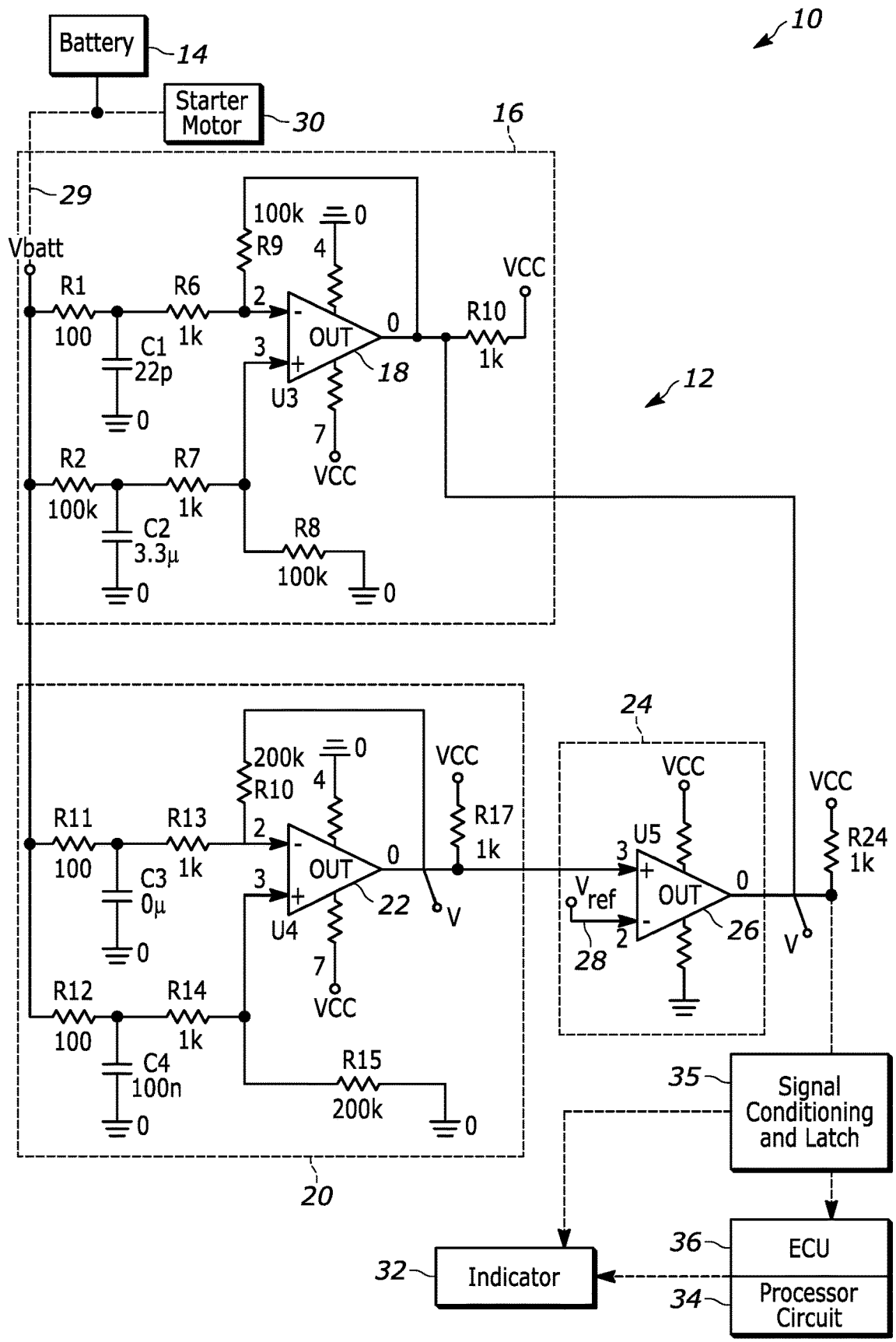
FIG. 1 is a diagram of a battery fault detection system including a detection circuit associated with a battery and an indicator of a vehicle, provided in accordance with an embodiment.

With reference to FIG. 1, a battery fault detection system is shown, generally indicated at 10, in accordance with an embodiment. The system 10 includes a detection circuit, generally indicated at 12, constructed and arranged to detect a faulty state of a battery 14. Detection circuit 12 comprises three circuits: a steep drop detector circuit 16 including a comparator 18 and various resistors R and capacitors C; a slope measurer circuit 20 including a comparator 22 and various resistors R and capacitors C; and a slope comparator circuit 24 including a includes a comparator 26 and a configurable reference voltage 28. The comparators 18, 22 and 26 are preferably of the LM2901 type, which is an open collector comparator.

The steep drop detector circuit 16 is electrically connected with the battery 14 and detects the first occurrence of a steep voltage drop and maintains its output high for a configurable amount of time (characteristic recovery time). The slope measurer circuit 20 measures the positive slopes of the battery voltage signal 29 while negative slopes result in 0 voltages. The output of the slope measurer circuit 20 is compared, by comparator 26 of the slope comparator circuit 24, with the reference voltage 28. If the measured positive slope value is less than the reference voltage 28, the comparison results in a logical low and if the measured positive slope value is greater than the reference voltage 28, the comparison results in a logical high. The output of each of the slope drop detector circuit 16 and the slope comparator circuit 24 are short circuited and since the comparators 18, 22 and 26 are open collectors, this results in a Boolean AND operation. This means that only if both conditions (sudden drop in battery voltage and slope output value is greater than reference voltage 28) are met, the output of the detection circuit 12 will be set to logical high, indicating a properly working battery 14. Otherwise, the output of the detection circuit will remain low, indicating a faulty battery 14.

Figure 2:
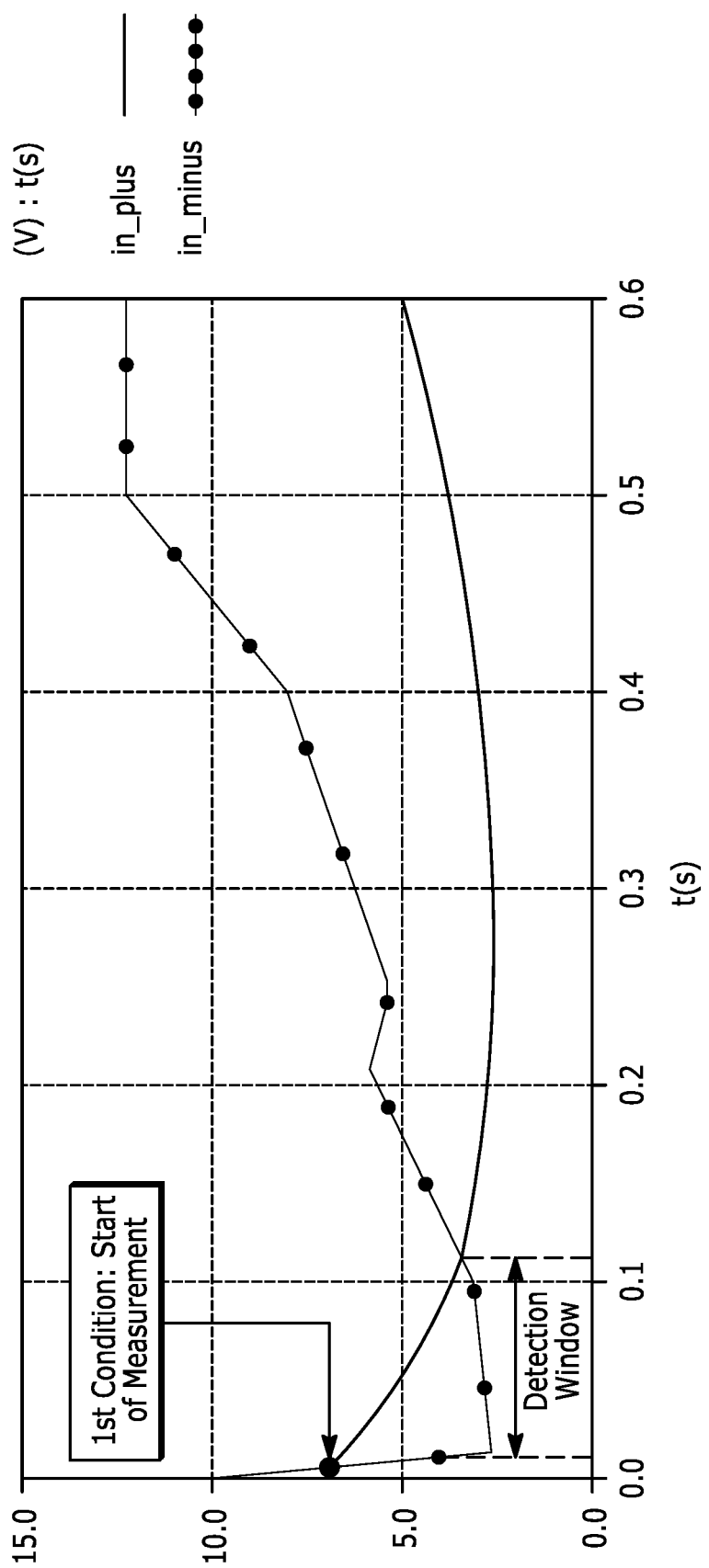
FIG. 2 is a graph showing the detection of a first condition by the circuit of FIG. 1: a sudden drop in battery voltage.
Figure 3:
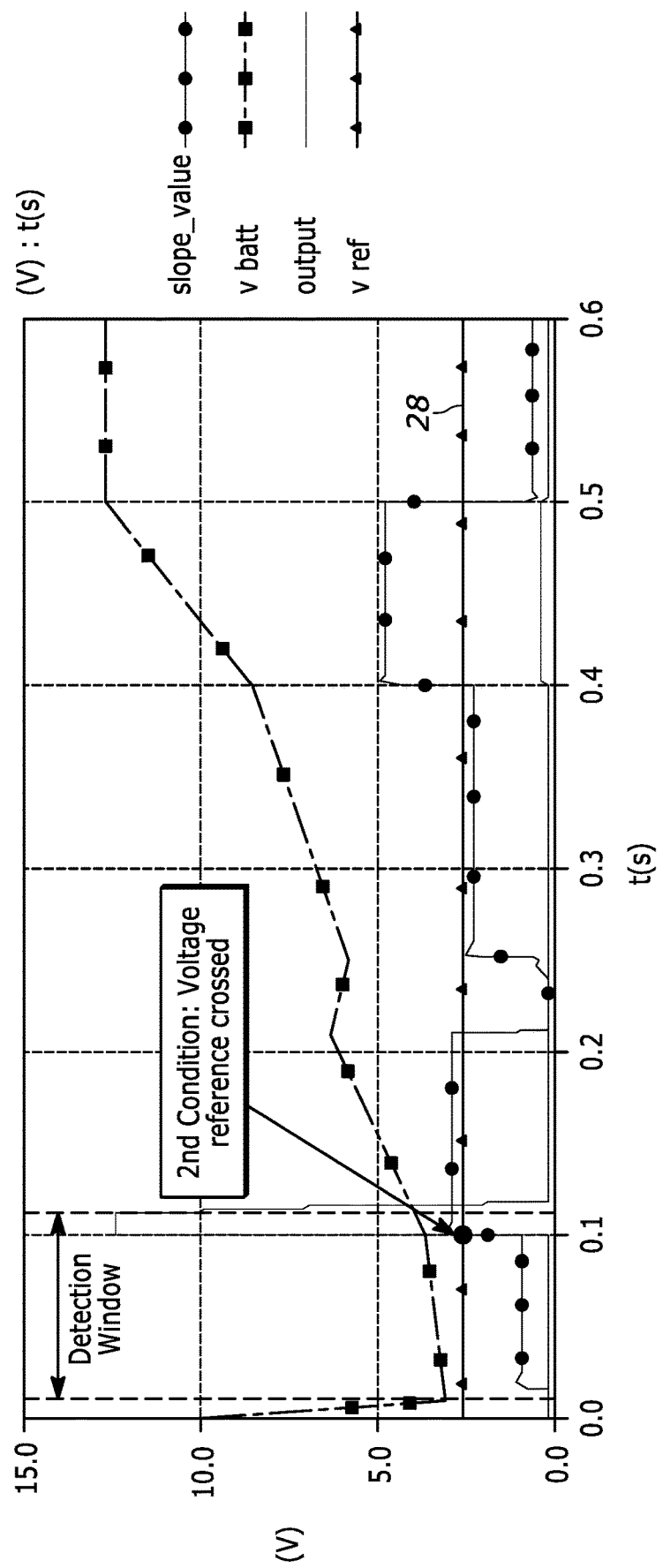
FIG. 3 is a graph showing the detection of a second condition by the circuit of FIG. 1: slope value being greater than a reference voltage Vref.

FIGS. 2 and 3 are graphs depicting the two conditions that have to be met for the system 10 to detect a healthy battery 14 behavior. In FIG. 2, a sudden drop in the battery voltage is detected. As long the in_plus signal is larger than the in_minus signal, the output of the steep drop detector 16 goes high. That provides a time window for the detection. In FIG. 3, the second condition is when the slope-value is larger than the vref value 28. This has to happen within the time window mentioned above.

Figure 4A:
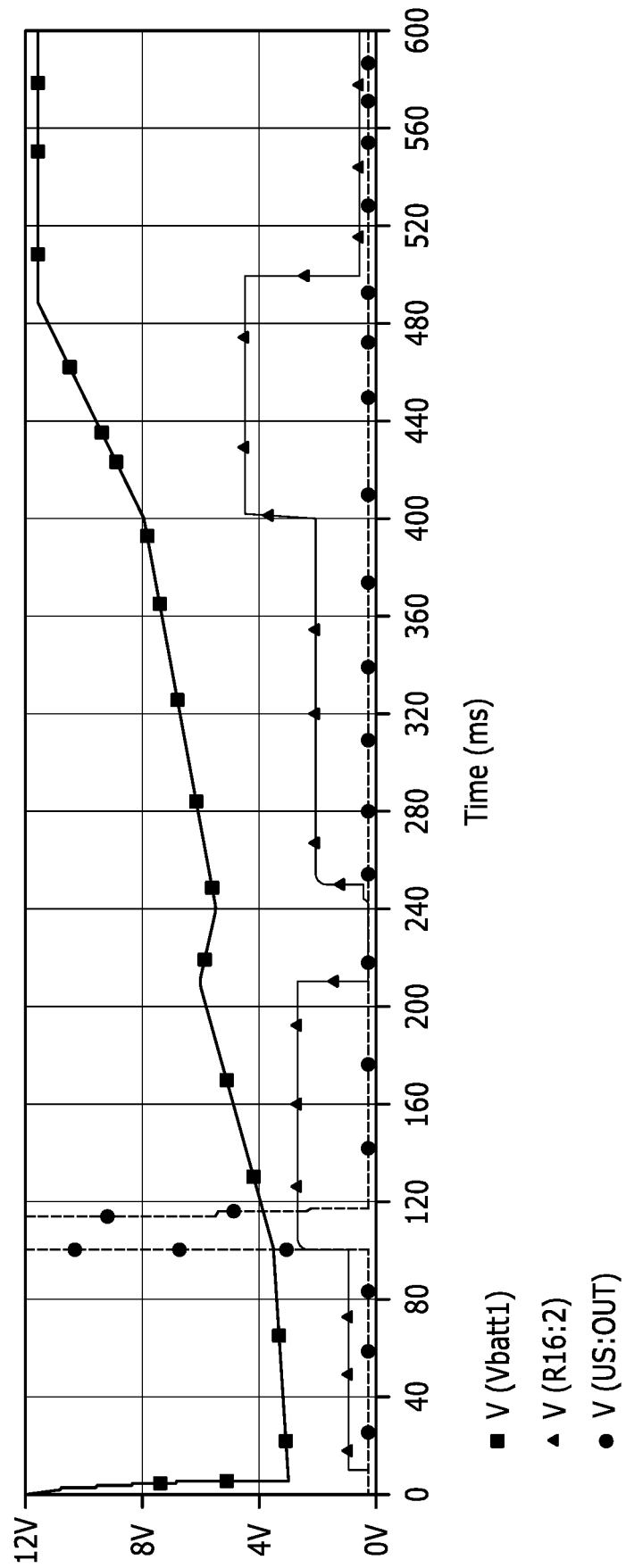
FIG. 4A is a plot showing the battery voltage drop during cranking condition and the detection flag in a "healthy" battery.
Figure 4B:
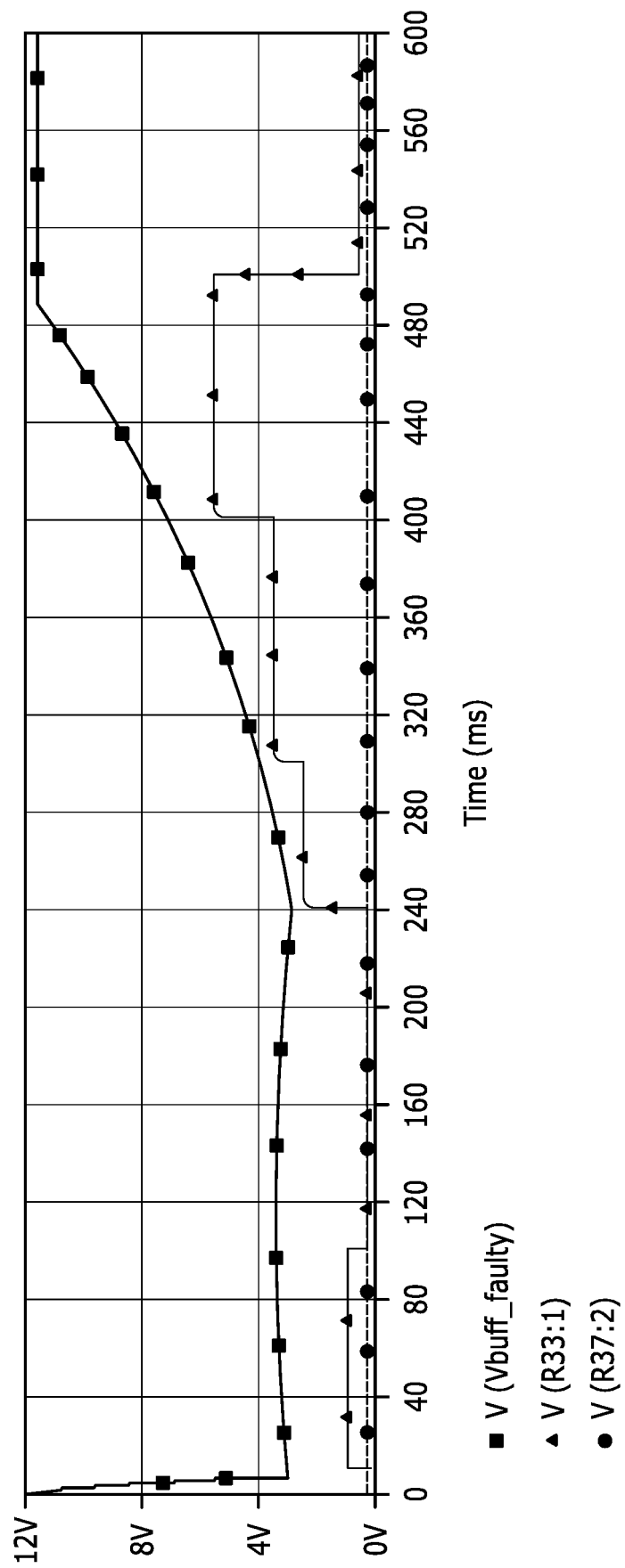
FIG. 4B is a plot showing the battery voltage drop during cranking condition and the detection flag in a "faulty" battery.

The graph of FIG. 4A depicts the voltage behavior of a healthy battery 14 upon crank phase (engine starter motor 30 is engaged). The graph of FIG. 4B depicts the voltage behavior of a faulty battery 14 upon crank pulse. The V(Vbatt) signal, depicted by the square identifier, detects voltage of the battery 14 and shows a sudden drop in the battery at the cranking pulse of the engine. This signal V(Vbatt) is in both FIGS. 4A and 4B. The signal depicted by the triangle identifier is from the output of the slope measurer circuit 20 and measures rate of change of V(Vbatt) (battery voltage). The steeper the slope, the higher this output signal becomes. In the case of negative slopes, the output goes to 0. Finally, the signal depicted by the circle identifier is the output of the detection circuit 12. It pulses high when a slope steeper than the reference value 28 is found within the time window given by the steep drop detector circuit 20.

The output of the detection circuit 12 is digital logic high and is connected with a signal conditioning and latch circuit 35. The output can activate a latch and with a buffer, turn on diagnostic indicator 32 (e.g., LED) on a vehicle's onboard display indicating battery condition, or can be a digital input to the processor circuit 34 of the ECU 36 to activate the indicator 32, with little or no additional computational power required. In addition to, or instead of activating the indicator 32 when a faulty battery condition is established, the ECU 36 can cause battery usage to be limited.

Thus, the system 10 measures the positive slopes of the battery voltage within a time window to determine state of heath of the battery 14 and relies on a single slope threshold that can be calculated and modified by the hardware engineer upon knowing the system characteristics set once and then never changed.

The system provides the battery's state of health to the user prior to battery failure. During the crank pulse (when the starter motor 30 is energized), a heavy load is suddenly connected to the battery and a voltage drop is expected. By characterizing such voltage drop, with the embodiment, it is possible to determine the conditions of the battery's state of health every time the vehicle is started. Thus, by monitoring the indicator 32, the user can check or replace the battery if needed. Since the system 10 only operates during a steep drop of the battery voltage (during cranking event), the system 10 operates more efficiently and only when needed, thus saving energy and computational effort.

Although the system 10 is preferably used for detecting the state of heath of a vehicle 12-volt battery, the system can be employed in any device that uses a battery and that has a repeated inrush current event.

Another embodiment to detect the state of health of a battery 14 could employ the steep voltage drop detector circuit 16 and then use a line integrator circuit (not shown) to determine the area under the curve of the cranking pulse voltage. Such area will be larger in for healthy battery than for a faulty battery.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the scope of the following claims.

What is claimed is:

1. A battery fault detection system comprising:
   a detection circuit comprising:
      a voltage drop detector circuit configured to detect a voltage drop of battery voltage across a battery; and
      a slope comparator circuit configured to, within a time window from the voltage drop across the battery detected by the drop detector circuit compare a rate of recovery of the voltage across the battery to a reference value, and output a signal that indicates health of the battery based on a result of comparing the rate of recovery of the voltage across the battery to the reference value within the time window.

2. The battery fault detection system of claim 1, further comprising:
   a slope measurer circuit configured to measure a slope of a battery voltage signal of the battery as the rate of recovery of the voltage across the battery,
   wherein the computer circuit is configured to compare the slope of the battery voltage signal of the battery to the reference value within the time window.

3. The battery fault detection system of claim 1, further comprising:
   an indicator configured to output a signal indicating the health of the battery.

4. The battery fault detection system of claim 1, wherein the battery if a 12-volt battery connected to a starter of a motor of a vehicle, and
   wherein the voltage drop detector circuit is configured to detect the voltage drop of the battery voltage across the battery when the starter of the motor of the vehicle is engaged.

5. The battery fault detection system of claim 1, wherein the comparator circuit comprises an open collector circuit.

6. The battery fault detection system of claim 1, wherein the time window comprises a window of time from the voltage drop across the battery during which a value of an in_plus signal of the battery is greater a value of an in_minus signal of the battery.

7. A method of detecting a state of health of a battery, the method comprising:
   detecting a voltage drop of a battery voltage across a battery;
   within a time window from the voltage drop across the battery, comparing a rate of recovery of the voltage across the battery to a reference value; and
   outputting a signal that indicates health of the battery based on a result of comparing the rate of recovery of the voltage across the battery to the reference value within the time window.

8. The method of claim 7, further comprising: measuring a slope of a battery voltage signal of the battery as the rate of recovery of the voltage across the battery, wherein the comparing comprises, within the time window from the voltage drop across the battery, comparing the slope of the battery voltage signal of the battery to the refernce value within the time window.

9. The method of claim 8, wherein the detecting comprises detecting the voltage drop of the battery voltage across the battery when a starter of a motor is engaged.

10. The method of claim 7, further comprising:
   activating an indicator that indicates the health of the battery.

11. The method of claim 7, further comprising:
   limiting use of the battery based on the signal indicating an unhealthy state of the battery.

12. The method of claim 7, further comprising:
   determining the time window as a window of time from the voltage drop across the battery during which a value of an in_plus signal of the battery is greater a value of an in_minus signal of the battery.

* * * * *